United States Patent
Song

(10) Patent No.: US 10,985,737 B2
(45) Date of Patent: Apr. 20, 2021

(54) HIGH-SPEED LOW-POWER LEVEL-SHIFTING CLOCK BUFFER

(71) Applicant: QUALCOMM Incorporated, San Diego, CA (US)

(72) Inventor: Tongyu Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/516,114

(22) Filed: Jul. 18, 2019

(65) Prior Publication Data

US 2020/0028495 A1 Jan. 23, 2020

Related U.S. Application Data

(60) Provisional application No. 62/701,352, filed on Jul. 20, 2018.

(51) Int. Cl.
*H03K 19/0175* (2006.01)
*H03K 3/012* (2006.01)
(Continued)

(52) U.S. Cl.
CPC ............ *H03K 3/012* (2013.01); *H03K 3/037* (2013.01); *H03K 19/0185* (2013.01); *H03K 19/017509* (2013.01); *H04L 7/0331* (2013.01); *H04W 52/0229* (2013.01); *H04W 56/001* (2013.01); *H03L 7/08* (2013.01)

(58) Field of Classification Search
CPC ..... H03K 19/018521; H03K 19/00315; H03K 19/018535; H03K 19/018528; H03K 3/356113; H03K 3/012; H03K 3/037; H03K 19/0175; H03K 19/017509; H03K 19/0185; H03K 19/018507; H03K 19/018514; H04L 7/0331; H04W 52/0229; H04W 56/001; H03L 7/08; G11C 8/08

See application file for complete search history.

(56) References Cited

U.S. PATENT DOCUMENTS

| 7,504,862 B2 * | 3/2009 | De Sandre ....... H03K 19/01707 326/80 |
| 2006/0033530 A1 * | 2/2006 | Seo .................... H03K 19/0016 326/81 |

(Continued)

FOREIGN PATENT DOCUMENTS

WO 2015163990 A1 10/2015

OTHER PUBLICATIONS

Hodges et al., "Analysis and Design of Digital Integrated Circuits", 2nd Edition, 1988 McGraw-Hill, Inc., pp. 408-411 (Year: 1998).*

(Continued)

*Primary Examiner* — Long Nguyen
(74) *Attorney, Agent, or Firm* — Haynes and Boone, LLP (36340)

(57) ABSTRACT

A DC-coupled buffer is provided with two switch transistors controlled by a delayed version of an output signal for the DC-coupled buffer. A first one of the switch transistors functions to cut off a current discharged into ground that would otherwise flow while an input signal for the DC-coupled buffer is discharged. A remaining second one of the switch transistors functions to increase the operating speed of the DC-coupled buffer.

14 Claims, 5 Drawing Sheets

(51) Int. Cl.
  *H03K 3/037* (2006.01)
  *H04W 56/00* (2009.01)
  *H04W 52/02* (2009.01)
  *H04L 7/033* (2006.01)
  *H03K 19/0185* (2006.01)
  *H03L 7/08* (2006.01)

(56) References Cited

U.S. PATENT DOCUMENTS

2006/0061386 A1* 3/2006 Kanzaki ......... H03K 19/018521
  326/81
2012/0120082 A1* 5/2012 Ku .................. H03K 19/00315
  345/520
2014/0145777 A1 5/2014 Ma
2015/0288365 A1 10/2015 Lai

OTHER PUBLICATIONS

International Search Report and Written Opinion—PCT/US2019/042595—ISA/EPO—dated Sep. 26, 2019.

* cited by examiner

HIGH-SPEED LOW-POWER LEVEL-SHIFTING CLOCK BUFFER

CROSS REFERENCE TO RELATED APPLICATIONS

The present application claims the benefit of U.S. Provisional Application No. 62/701,352, filed Jul. 20, 2018 and entitled "High-Speed Low-Power Level-Shifting Clock Buffer" the contents of which is incorporated by reference herein.

TECHNICAL FIELD

This application relates to clock buffers, and more particularly to a high-speed low-power level-shifting clock buffer.

BACKGROUND

The power supply voltage for digital cores has decreased as transistor dimensions shrink. But input/output (I/O) legacy standards typically use higher power supply voltages. If a core signal must be transmitted to external circuits, it is thus conventional to level-shift the signal from the internal power supply voltage to an I/O power supply voltage. An example of such a signal would be a clock signal from a voltage-controlled oscillator (VCO) controlled in a phase-locked loop. A clock buffer for the clock signal not only buffers the clock signal but level-shifts it from the internal power supply voltage to the I/O power supply voltage.

The clock buffering and level shifting may be performed using a number of alternative architectures. For example, the input clock signal drives an internal node through a capacitor and a resistor in an alternating current (AC)-coupled buffer. The resulting passive devices in an AC-coupled buffer decrease density. Moreover, the time constant for the resistor-capacitor (RC) combination limits the frequency range for an AC-coupled buffer. To avoid the need for passive devices and the associated frequency limitations of an AC-coupled buffer, it is known to use a direct current (DC)-coupled buffer. An example DC-coupled buffer 100 is shown in FIG. 1. DC-coupled buffer 100 resides within an input/output (I/O) power domain powered by an I/O power supply voltage VDDH. An inverter for inverting an input clock signal Vin to form a complement or inverted clock signal Vin_b resides within an internal power domain powered by an internal power supply voltage VDDL that is lower than the I/O power supply voltage VDDH.

The inverted clock signal Vin_b drives a gate of a first pull-down NMOS transistor M1 having a source tied to ground. The drain of the first pull-down transistor M1 will thus be pulled low when the input clock signal Vin is low. The drain of first pull-down transistor M1 is tied to a current mirror terminal 120 for a current mirror formed by a diode-connected PMOS transistor P1 and a current-mirror PMOS transistor P2. In particular, a drain and a gate of diode-connected PMOS transistor P1 form a current mirror terminal 120, which is also tied to the gate of current-mirror transistor P2. The sources of transistors P1 and P2 are tied to a power rail for the I/O power supply voltage VDDH. The discharge of the drain for first pull-down transistor M1 will thus switch on diode-connected transistor P1 to conduct a current that is mirrored by current-mirror transistor P2.

The drain of current-mirror transistor P2 is tied to the drain of a second pull-down NMOS transistor M2 having a source connected to ground. The input clock signal Vin drives the gate of second pull-down transistor M2 such that second pull-down transistor M2 will be off when the inverted input clock signal Vin_b is high (charged to VDDL). The current conducted by current-mirror transistor P2 will thus charge an internal node 110 in response to a falling edge for the input clock signal Vin. An inverter 115 inverts the voltage of internal node 110 to drive an output clock signal Vout. The output clock signal Vout will thus be discharged low to ground in response to the falling edge of the input clock signal Vin. In response to a rising edge of the input clock signal Vin, second pull-down transistor M2 switches on to pull node 110 low so that inverter 115 charges the output clock signal Vout high to VDDH. Although DC-coupled buffer 100 does not need any passive devices and does not have the frequency restrictions of an AC-coupled buffer, the serial combination of diode-connected transistor P1 and first pull-down transistor M1 discharges current into ground while the input clock signal Vin is low. In addition, the response of the output clock signal Vout to the rising edge of the input clock signal Vin is slowed by a struggle between current-mirror transistor P2 and second pull-down transistor M2 because current-mirror transistor P2 will still be on at the rising edge transition of the input clock signal Vin and will thus slow the discharge of internal node 110. DC-coupled buffer 100 thus has relatively high power consumption and reduced operating speed.

Accordingly, there is a need in the art for a DC-coupled level-shifting clock buffer with reduced power consumption and increased operating speed.

SUMMARY

In accordance with a first aspect of the disclosure, a level-shifting buffer is disclosed that includes a first transistor configured to switch on responsive to an assertion of a complement input signal to discharge a pull-down node coupled to a terminal of the first transistor; a current mirror configured to charge an internal node in response to a discharge of a current mirror terminal; a first switch transistor configured to switch off subsequent to an expiration of a delay following a discharge of an output signal, wherein the first switch transistor is coupled between the pull-down node and the current mirror terminal; a second transistor configured to discharge the internal node responsive to an assertion of an input signal to a first power supply voltage, wherein the complement input signal is a complement of the input signal; and an inverter configured to invert a voltage of the internal node to form the output signal, wherein the inverter is powered by a second power supply voltage that is greater than the first power supply voltage.

In accordance with a second aspect of the disclosure, a method of level-shifting an input signal to form an output signal is disclosed that includes the acts of: conducting an input current for a current mirror responsive to an assertion of a complement input signal, wherein the complement input signal is a complement of the input signal; mirroring the input current through the current mirror to form a mirrored current; charging an internal node with the mirrored current; discharging the output signal responsive to the charging of the internal node; switching off the input current responsive to an expiration of a delay after the discharging of the output signal; discharging the internal node responsive to an assertion of the input signal to a first power supply voltage; and asserting the output signal to a second power supply voltage responsive to the discharging of the internal node, wherein the second power supply voltage is greater than the first power supply voltage.

In accordance with a third aspect of the disclosure, a level-shifting buffer, is disclosed that includes a first transistor configured to switch on responsive to an assertion of a complement input signal to discharge a pull-down node coupled to a terminal of the first transistor; a current mirror configured to charge an internal node in response to a discharge of a current mirror terminal; a second transistor configured to discharge the internal node responsive to an assertion of an input signal to a first power supply voltage, wherein the complement input signal is a complement of the input signal; a first inverter configured to invert a voltage of the internal node to form the output signal, wherein the first inverter is powered by a second power supply voltage that is greater than the first power supply voltage; and means for controlling an input current for the current mirror to conduct through the first transistor during a delay period starting with the assertion of the complement input signal and for shutting off the input current following an expiration of the delay period.

These and other advantageous features may be better appreciated through the following detailed description.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

A DC-coupled buffer is provided that includes a first pull-down NMOS transistor having its gate driven by an inverted version of an input signal. The input signal and its complement are generated in a first power domain powered by a first power supply voltage whereas the DC-coupled buffer is in a second power domain powered by a second power supply voltage that is greater than the first power supply voltage. An output signal from the DC-coupled buffer will thus be level-shifted with respect to the input signal. To reduce power consumption and increase operating speed, the drain of the first pull-down transistor couples through a first switch transistor to a current mirror formed by a diode-connected transistor having its gate connected to the gate of a current-mirror transistor so that the current-mirror transistor conducts a current into an internal node when both the first pull-down transistor and the first switch transistor are on. An inverter inverts a voltage of the internal node to form the output signal.

The internal node couples to ground through a second pull-down transistor having its gate driven by the input signal. Following a falling edge for the input signal, the second pull-down transistor will thus be off while the current mirror charges the internal node so that the inverter discharges the output signal to ground. A delayed version of the output signal drives a gate of the first switch transistor. The first switch transistor will thus be switched off after an expiration of a delay following the falling edge of the input signal. This prevents the diode-connected transistor from discharging current after the delay subsequent to the falling edge of the input signal so that power consumption is reduced. In addition, a second switch transistor connects between a power rail for the second power domain and the gates of the diode-connected transistor and the current-mirror transistor. The delayed version of the output signal also drives a gate of the second switch transistor. The second switch transistor will thus switch on following the delay after the falling edge of the input signal to turn off the current mirror transistor and the diode-connected transistor. Since the current mirror transistor will thus be off at the rising edge of the input signal, there will be no struggle with the second pull-down transistor to discharge the internal node so that the operating speed of the DC-coupled buffer is advantageously increased.

Figure 1:
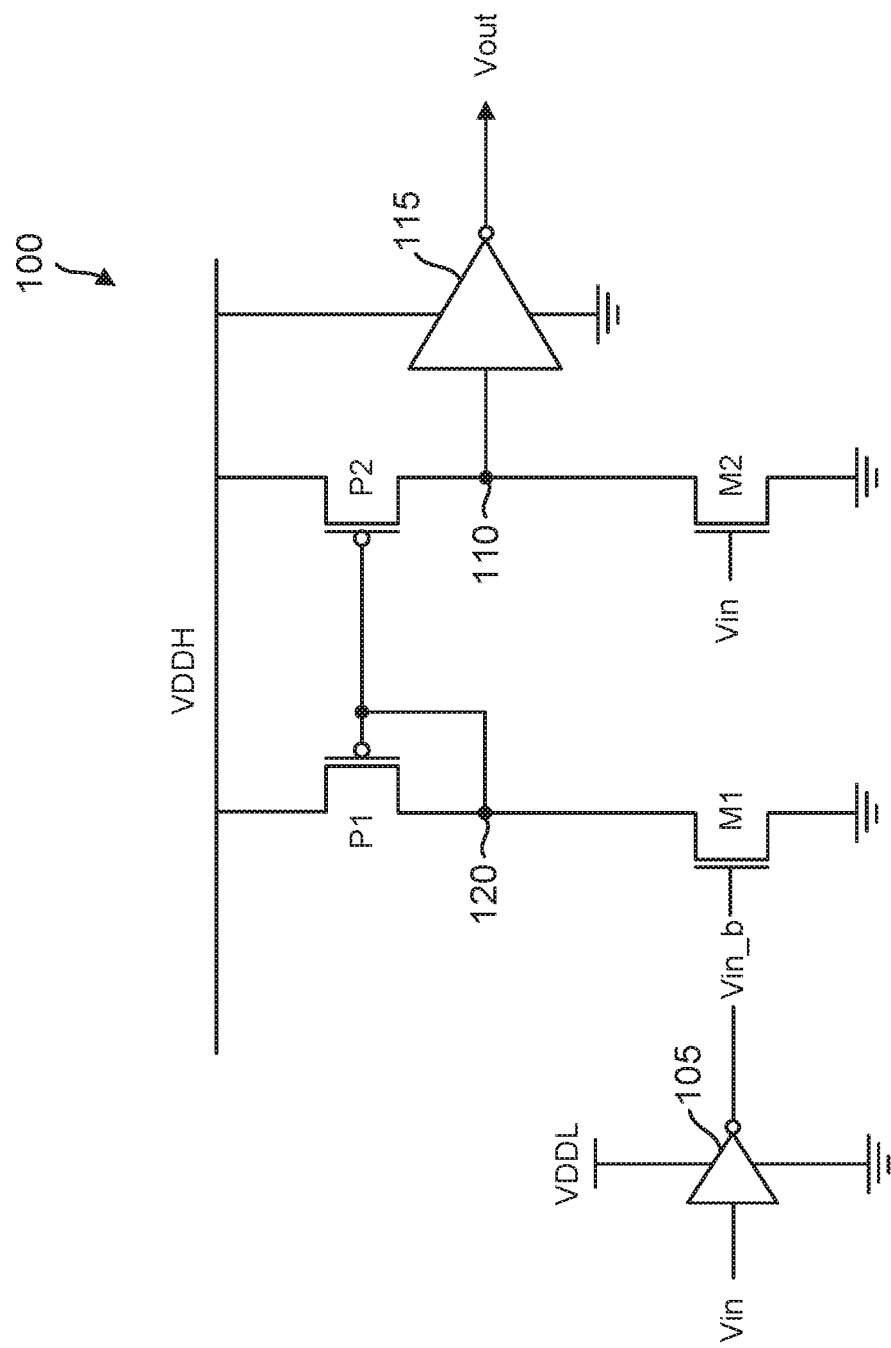
FIG. 1 is a circuit diagram of a conventional DC-coupled buffer.
Figure 2:
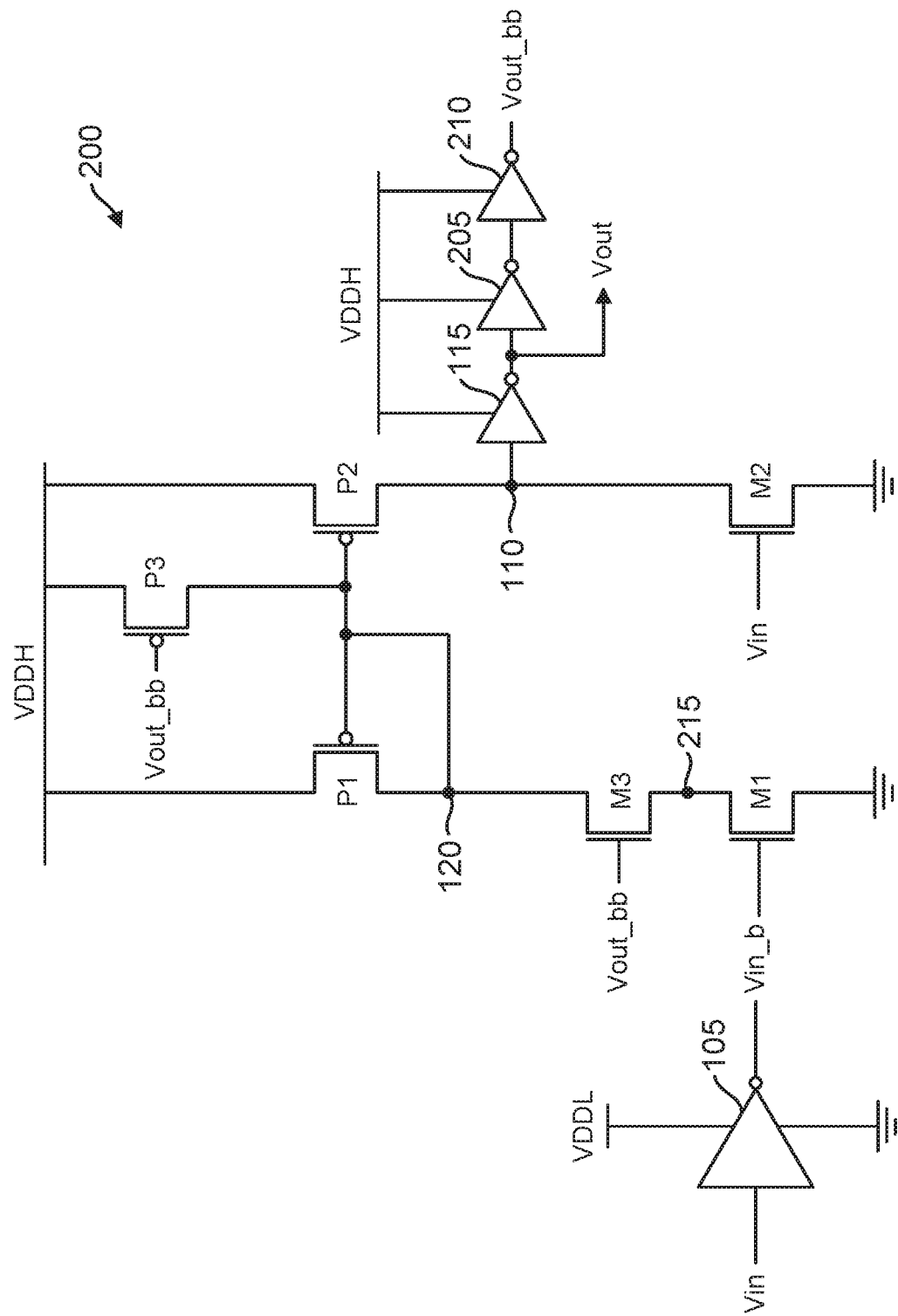
FIG. 2 is a circuit diagram of a low-power high-speed DC-coupled buffer in accordance with an aspect of the disclosure.

The following discussion will assume that the DC-coupled buffer is a clock buffer but it will be appreciated that other types of signals may be buffered and level-shifted by the DC-coupled buffer disclosed herein. The following discussion will also assume that the first power supply voltage is the internal power supply voltage VDDL and that the second power supply voltage is the I/O power supply voltage VDDH. But it will be appreciated that the DC-coupled buffer disclosed herein may be used to level-shift between other types of power supply voltages. An example DC-coupled buffer 200 is shown in FIG. 2. First pull-down transistor M1, current mirror terminal 120, second pull-down transistor M2, diode-connected transistor P1, current mirror transistor P2 as well as inverters 105 and 115 function as discussed with regard to DC-coupled buffer 100. Following a falling edge for input clock signal Vin, complement input clock signal Vin_b will be charged high to VDDL by inverter 105. Complement input clock signal Vin_b drives the gate of first pull-down transistor M1, which has a source connected to ground. First pull-down transistor M1 then switches on to discharge a pull-down node 215 at a drain of first pull-down transistor M1. First pull-down transistor M1 may also be referred to herein as simply a first transistor.

Pull-down node 215 couples through a first switch NMOS transistor M3 to current-mirror terminal 120, which comprises a drain of diode-connected transistor P1 that is in the current mirror configuration with current-mirror transistor P2. The sources of diode-connected transistor P1 and current-mirror transistor P2 are tied to a power supply node for the I/O power supply voltage VDDH. A delayed version of the output signal (Vout bb) drives the gate of first switch transistor M3 such that first switch transistor M3 will still be on at the falling edge of the input clock signal Vin. The discharge of pull-down node 215 thus discharges current mirror terminal 120 to cause diode-conducted transistor P1 to conduct an input current for the current mirror through first switch transistor M3 and first pull-down transistor M1 to ground. This input current for the current mirror is then mirrored by current-mirror transistor P2 into a current mirror current that charges internal node 110 towards VDDH. Second pull-down transistor M2 is off prior to the rising edge for the input clock signal Vin. Second pull-down transistor M2 is also referred to herein as a second transistor.

The charging of the voltage for internal node 110 is inverted through inverter 115 to cause the output clock signal Vout to discharge low to ground. A serial combination of an inverter 205 and an inverter 210 delay the output clock signal Vout to form the delayed output clock signal Vout bb. Following the expiration of the delay introduced by the serial combination of inverters 205 and 210, the first switch transistor M3 will be switched off after the falling edge for the output signal Vout. In this fashion, the input current that would otherwise continue to discharge to ground through diode-connected transistor P1 and first pull-down transistor M1 while the input clock signal Vin is low is cutoff. But because of this delay, there is a brief period following the falling edge of the input clock signal Vin in which both first pull-down transistor M1 and first switch transistor are on so that the current mirror formed by diode-connected transistor P1 and current-mirror transistor P2 can charge internal node 110 to force the output clock signal Vout to have a falling edge. Inverters 205 and 210 as well as first switch transistor M3 may be deemed to form a means for controlling an input current for the current mirror to conduct through the first transistor during a delay period starting with the assertion of the complement input signal and for shutting off the input current following an expiration of the delay period.

A second switch PMOS transistor P3 connects between current mirror terminal 120 (the gates of diode-connected transistor P1 and current-mirror transistor P2) and the power rail for the I/O power supply voltage VDDH. The delayed output clock signal Vout bb drives the gate of second switch transistor P3 such that second switch transistor P3 will be switched on after the delay following the falling edge of the output clock signal Vout. This switching on of second switch transistor P3 charges the gates of current-mirror transistor P2 and diode-connected transistor P1 to switch current-mirror transistor P2 off prior to the rising edge of the input clock signal Vin. There will thus be no PMOS transistor struggle with the second pull-down transistor M2 when second pull-down transistor M2 switches on in response to the rising edge of the input clock signal Vin. Second pull-down transistor M2 may thus quickly discharge internal node 110 to cause a rising edge in the output clock signal Vout. DC-coupled buffer 200 is thus advantageously both low power and high-speed.

Figure 3:
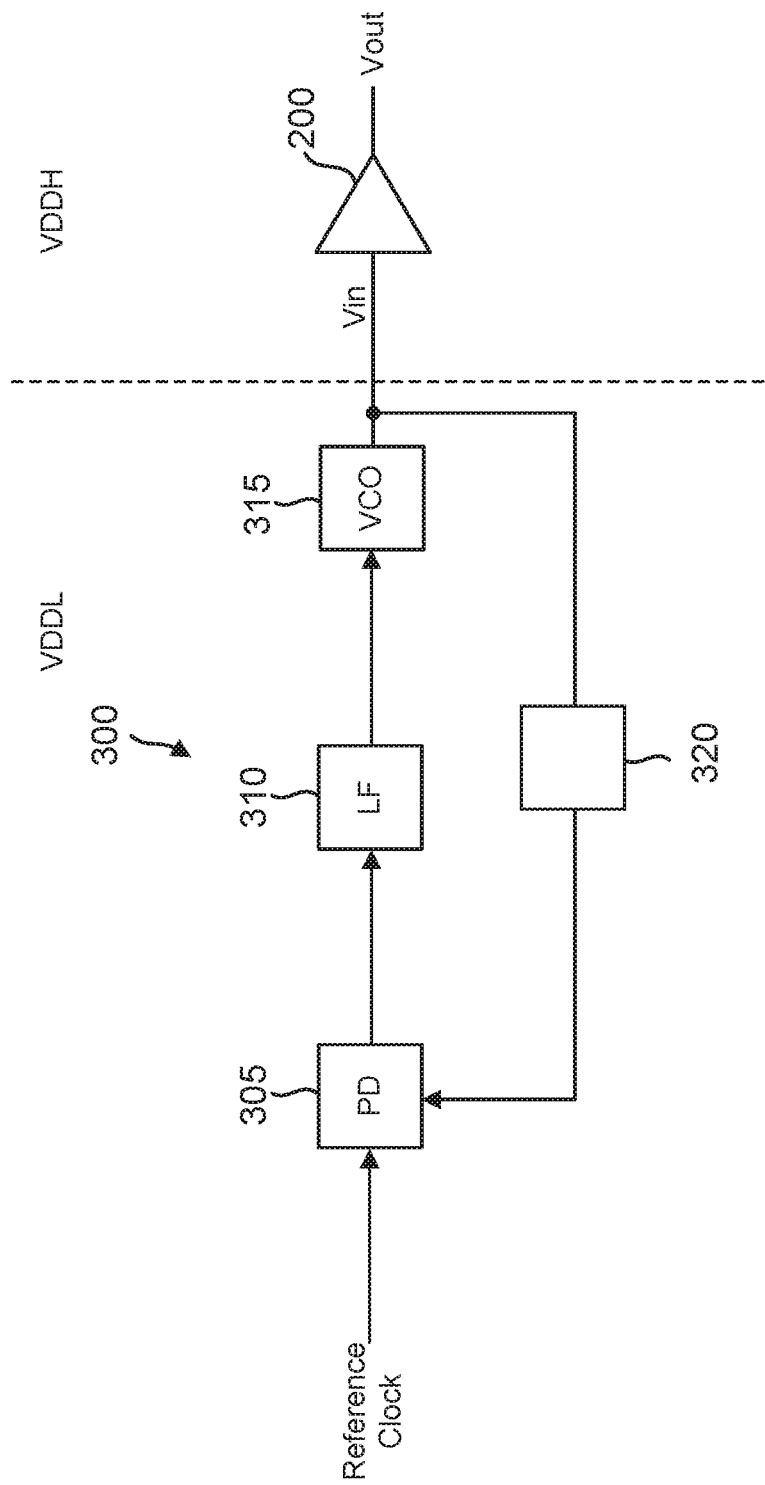
FIG. 3 is a diagram of a phase-locked loop (PLL) integrated with the DC-coupled buffer of FIG. 2.

DC-coupled buffer 200 may be integrated with a phase-locked loop (PLL) 300 as shown in FIG. 3. PLL 300 resides within the internal power domain powered by the internal power supply voltage VDDL. PLL 300 includes a phase detector 305 that compares the phase of a reference clock signal to a feedback signal from a clock divider 320. Depending upon the phase difference between the two signals, phase detector 305 drives a loop filter 310 that filters the output from phase detector 305 to drive a voltage-controlled oscillator (VCO) 315 with a control voltage signal. VCO 315 produces the input clock signal Vin that drives DC-coupled buffer 200. Clock divider 320 divides the input clock signal Vin in frequency to form the feedback signal. DC-coupled buffer 200 allows PLL 300 to clock external devices with the output clock signal Vout synchronously with the reference clock signal.

Figure 4:
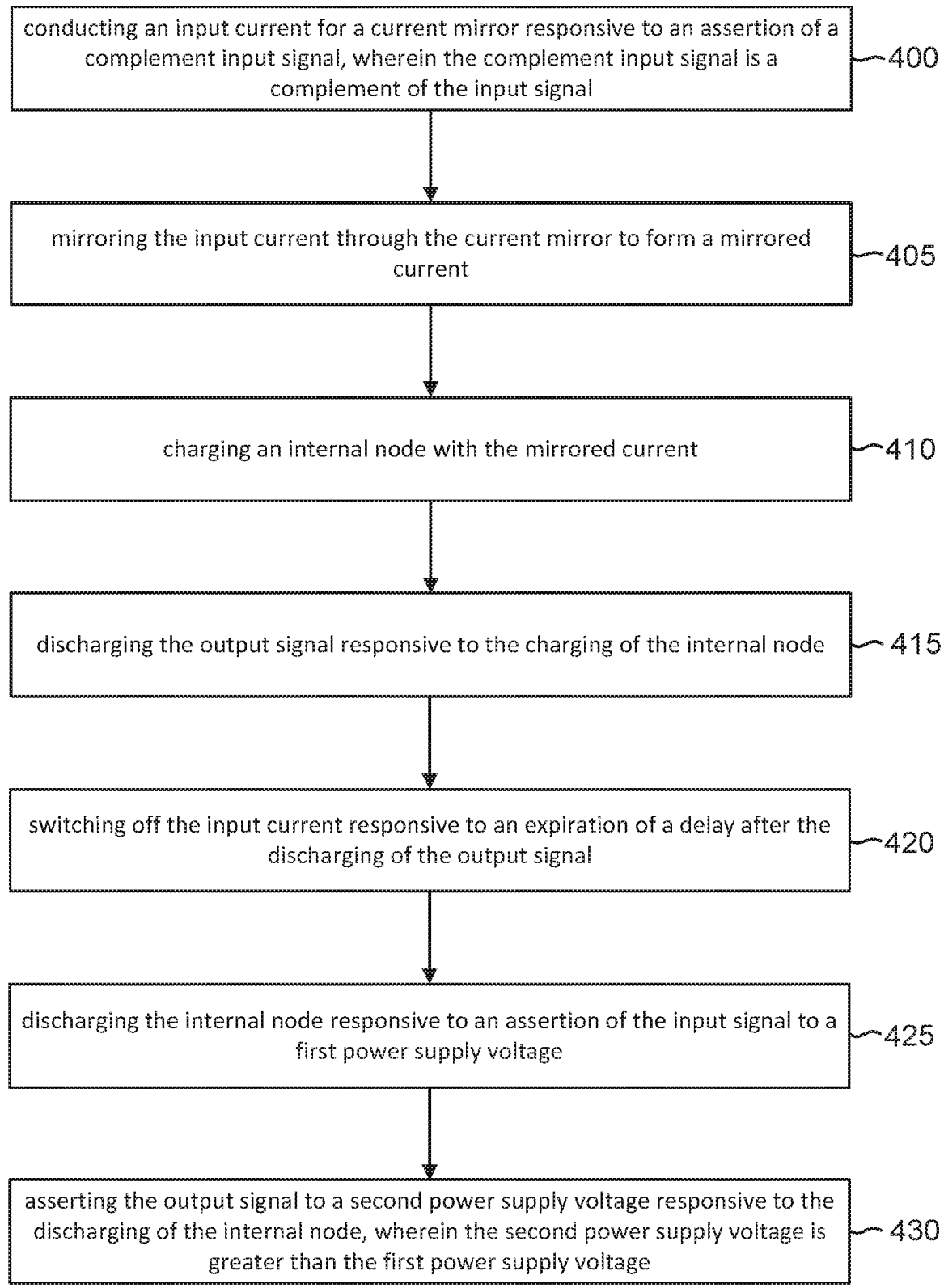
FIG. 4 is a flowchart for a method of level-shifting an input signal into an output signal in accordance with an aspect of the disclosure.

A method of buffering and level-shifting an input signal into an output signal will now be discussed with regard to the flowchart of FIG. 4. The method includes an act 400 of conducting an input current for a current mirror responsive to an assertion of a complement input signal, wherein the complement input signal is a complement of the input signal. The conduction of the input current through pull-down transistor M1 in response to the rising edge for the complement input signal Vin_b is an example of act 400. The method further includes an act of mirroring the input current through the current mirror to form a mirrored current. The conduction of the mirrored current through current mirror transistor P2 is an example of act 405. In addition, the method includes an act 410 of charging an internal node with the mirrored current. The charging of internal node 110 is an example of act 410. The method also includes an act 415 of discharging the output signal responsive to the charging of the internal node. The discharging of the output signal Vout in response to the discharging of internal node 110 is an example of act 415. In addition, the method includes an act 420 of switching off the input current responsive to an expiration of a delay after the discharging of the output signal. The switching off of first switch transistor M3 to stop the conduction of the input current through pull-down transistor M1 to ground is an example of act 420. The method further includes an act 425 of discharging the internal node responsive to an assertion of the input signal to a first power supply voltage. The discharge of internal node 110 due to the switching on of second pull-down transistor M2 is an example of act 425. Finally, the method includes an act 430 of asserting the output signal to a second power supply voltage responsive to the discharging of the internal node, wherein the second power supply voltage is greater than the first power supply voltage. The charging of the output signal Vout to the I/O power supply voltage VDDH is an example of act 430.

Figure 5:
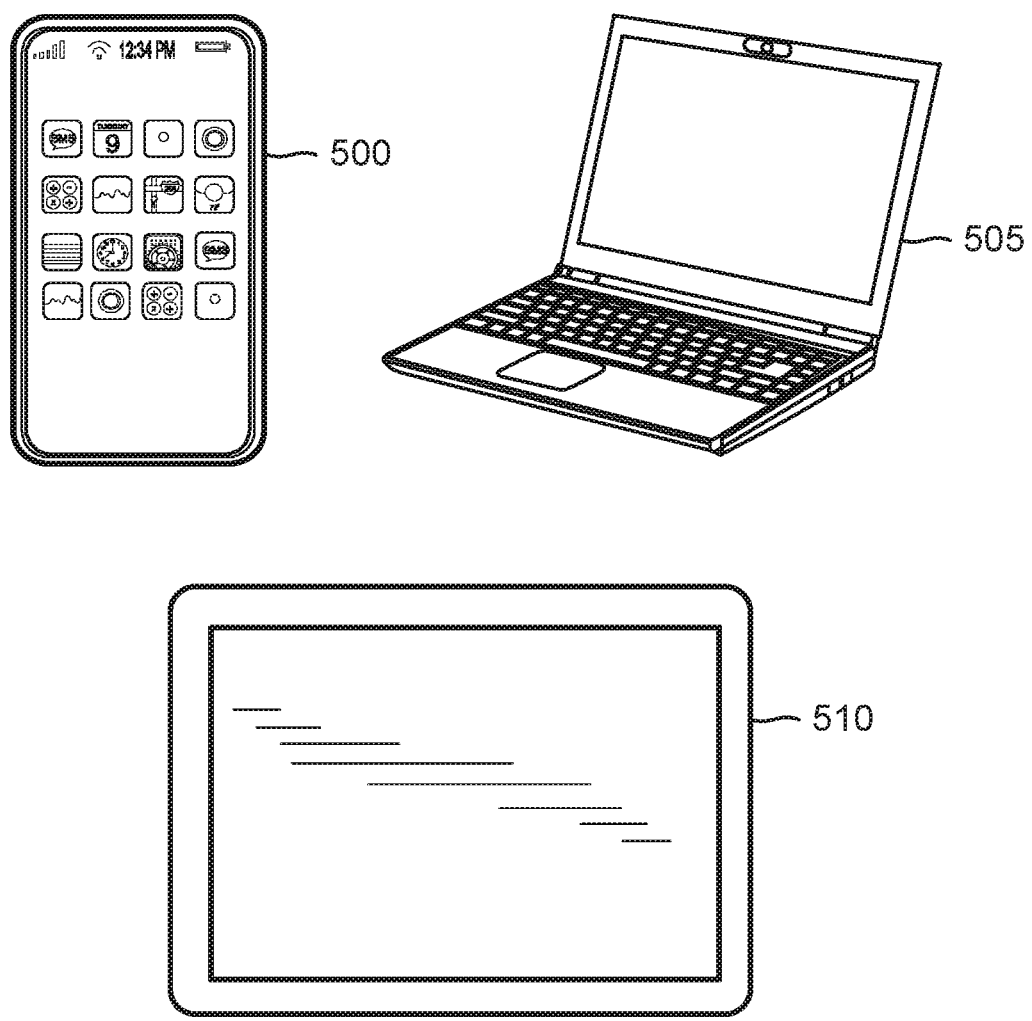
FIG. 5 illustrates some example electronic systems each incorporating a DC-coupled buffer in accordance with an aspect of the disclosure.

A DC-coupled buffer and level-shifter as disclosed herein may be incorporated into a wide variety of electronic systems. For example, as shown in FIG. 5, a cellular telephone 500, a laptop computer 505, and a tablet PC 510 may all include a memory having a DC-coupled buffer and level-shifter in accordance with the disclosure. Other exemplary electronic systems such as a music player, a video player, a communication device, and a personal computer may also be configured with DC-coupled buffers and level-shifters constructed in accordance with the disclosure.

It will be appreciated that many modifications, substitutions and variations can be made in and to the materials, apparatus, configurations and methods of use of the devices of the present disclosure without departing from the scope thereof. In light of this, the scope of the present disclosure should not be limited to that of the particular embodiments illustrated and described herein, as they are merely by way of some examples thereof, but rather, should be fully commensurate with that of the claims appended hereafter and their functional equivalents.

What is claimed is:

1. A level-shifting buffer, comprising:
a first transistor configured to switch on responsive to an assertion of a complement input signal to discharge a pull-down node coupled to a terminal of the first transistor;
a current mirror configured to charge an internal node in response to a discharge of a current mirror terminal;
a second transistor configured to discharge the internal node responsive to an assertion of an input signal to a first power supply voltage, wherein the complement input signal is a complement of the input signal;
an inverter configured to invert a voltage of the internal node to form the output signal, wherein the inverter is powered by a second power supply voltage that is greater than the first power supply voltage;
a series of inverters configured to delay the output signal to form a delayed output signal; and
a first switch transistor configured to switch off responsive to a discharge of the delayed output signal, wherein the first switch transistor is coupled between the pull-down node and the current mirror terminal.

2. The level-shifting buffer of claim 1, wherein the current mirror comprises:
   a diode-connected transistor having a drain and a gate configured to form the current mirror terminal; and
   a current-mirror transistor having a gate connected to the current mirror terminal, wherein a drain of the current-mirror transistor is coupled to the internal node.

3. The level-shifting buffer of claim 2, further comprising:
   a second switch transistor, wherein the second switch transistor is coupled between a power rail and the current mirror terminal, and wherein the second switch transistor is configured switch on responsive to the discharge of the delayed output signal.

4. The level-shifting buffer of claim 3, wherein the first transistor, the second transistor, and the first switch transistor are all n-type metal-oxide semiconductor (NMOS) transistors, and wherein the diode-connected transistor, the current-mirror transistor, and the second switch transistor are all p-type metal-oxide semiconductor (PMOS) transistors.

5. The level-shifting buffer of claim 1, wherein the input signal is an output clock signal from a phase-locked loop.

6. The level-shifting buffer of claim 1, wherein the level-shifting buffer is incorporated into a cellular telephone.

7. The level-shifting buffer of claim 1, wherein the input signal is an input clock signal, and wherein the output signal is an output clock signal.

8. A method of level-shifting an input signal to form an output signal, comprising:
   conducting an input current for a current mirror responsive to an assertion of a complement input signal, wherein the complement input signal is a complement of the input signal;
   mirroring the input current through the current mirror to form a mirrored current;
   charging an internal node with the mirrored current;
   discharging the output signal responsive to the charging of the internal node;
   delaying the output signal to form a delayed output signal;
   switching off the input current responsive to a discharge of the delayed output signal;
   discharging the internal node responsive to an assertion of the input signal to a first power supply voltage; and
   asserting the output signal to a second power supply voltage responsive to the discharging of the internal node, wherein the second power supply voltage is greater than the first power supply voltage.

9. The method of claim 8, further comprising:
   by delaying the output signal through a series of inverters to form the delayed output signal.

10. The method of claim 9, further comprising:
    switching off a first switch transistor responsive to the discharge of the delayed output signal to switch off the input current.

11. The method of claim 10, further comprising:
    switching on a second switch transistor responsive to the discharge of the delayed output signal to switch off the mirrored current.

12. The method of claim 8, further comprising:
    inverting the input signal in a first inverter powered by the first power supply voltage to form the complement input signal.

13. The method of claim 12, further comprising:
    inverting a voltage of the internal node in a second inverter powered by the second power supply voltage to form the output signal.

14. The method of claim 13, wherein the input signal is an input clock signal, and wherein the output signal is an output clock signal.

* * * * *